United States Patent [19]

Wei

[11] Patent Number: 5,500,382
[45] Date of Patent: Mar. 19, 1996

[54] SELF-ALIGNED CONTACT PROCESS

[75] Inventor: Che-Chia Wei, Plano, Tex.

[73] Assignee: SGS-Thomson Microelectronics, Inc., Carrollton, Tex.

[21] Appl. No.: 293,140

[22] Filed: Aug. 19, 1994

Related U.S. Application Data

[62] Division of Ser. No. 116,050, Sep. 2, 1993, Pat. No. 5,369,303, which is a continuation of Ser. No. 786,019, Oct. 31, 1991, abandoned.

[51] Int. Cl.⁶ .................................................. H01L 21/768
[52] U.S. Cl. ............................ 437/44; 437/190; 437/984
[58] Field of Search ............................ 437/44, 195, 984, 437/190

[56] References Cited

U.S. PATENT DOCUMENTS

| | | |
|---|---|---|
| 4,743,564 | 5/1988 | Sato et al. . |
| 4,855,798 | 8/1989 | Imamura et al. . |
| 4,922,311 | 5/1990 | Lee et al. . |
| 5,019,527 | 5/1991 | Ohshima et al. ........................ 437/984 |
| 5,043,790 | 8/1991 | Butler . |
| 5,075,762 | 12/1991 | Kondo et al. . |

OTHER PUBLICATIONS

Wolf, "Silicon Processing for the VLSI Era", 1986, pp. 539–546.

Primary Examiner—Chandra Chaudhari
Attorney, Agent, or Firm—Kenneth C. Hill; Lisa K. Jorgenson; Richard K. Robinson

[57] ABSTRACT

A method for forming a self-aligned contact utilizes a thin insulating layer formed on the upper surface of a conductive layer. A barrier layer is deposited over the insulating layer, and gate electrodes are then defined. Sidewall spacers are formed along the vertical sidewalls of the gate electrodes. During formation of the sidewall spacers the barrier layer protects the gate electrodes. A second insulating layer is then deposited and a via is opened to the substrate. A contact can now be created by depositing conductive material into the via.

39 Claims, 3 Drawing Sheets

SELF-ALIGNED CONTACT PROCESS

This is a Division of application Ser. No. 08/116,050, filed Sep. 2, 1993 which is a continuation of application Ser. No. 07/786,019, now abandoned, filed Oct. 31, 1991.

BACKGROUND OF THE INVENTION

1. Field of the Invention

The present invention relates generally to semiconductor integrated circuits, and more specifically to the formation of self-aligned contacts in an integrated circuit.

2. Description of the Prior Arts

In manufacturing high density integrated circuits, improving processing steps to allow for increased utilization of the area on a device is a concern. Masking layers are frequently used in the fabrication of an integrated circuit. When using a mask, it is important to account for errors in alignment between the mask and the device. Typically, this is done by building alignment tolerances into the size of the mask. During the manufacturing process, these tolerances add up such that the amount of available space on the device is reduced.

The self-aligned contact is widely used in high density circuits in order to save area. One approach to forming a self-aligned contact is to use a thick layer of oxide on top of a conductive layer in a gate. The purpose of the thick oxide layer is to protect the conductive layer during subsequent processing steps.

Typically, anisotropic etches are performed when fabricating gates and vias in an integrated circuit. It is common to over etch a layer to ensure complete removal of the material. The thick oxide protects the conductive layer from being etched into during formation of the gates and vias. This prevents the conductive layer from connecting to an active area in the substrate, which would result in shorting out the component.

The thick oxide required in this process, however, increases the severity of the topography of the device. As one skilled in the art will recognize, the severe topography makes subsequent processing steps more difficult. Tall features result in step coverage problems for later interconnect layers.

Therefore, it would be desirable to provide a method for forming self-aligned contacts which results in a more planar topography, without significantly increasing the complexity of the manufacturing process.

SUMMARY OF THE INVENTION

It is therefore an object of the present invention to provide a method for forming self-aligned contacts which have reduced height and are more nearly planar with the upper surface of the semiconductor substrate.

It is another object of the present invention to provide such a method and structure which is compatible with standard process flows, and which add minimal additional complexity to the fabrication of a typical integrated circuit.

Therefore, according to the present invention, a method for forming a self-aligned contact utilizes a thin insulating layer formed on the upper surface of a conductive layer. A barrier layer is deposited over the insulating layer, and gate electrodes are then defined. Sidewall spacers are formed along the vertical sidewalls of the gate electrodes. During formation of the sidewall spacers the barrier layer protects the gate electrodes. A second insulating layer is then deposited and a via is opened to the substrate. A contact can now be created by depositing conductive material into the via.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
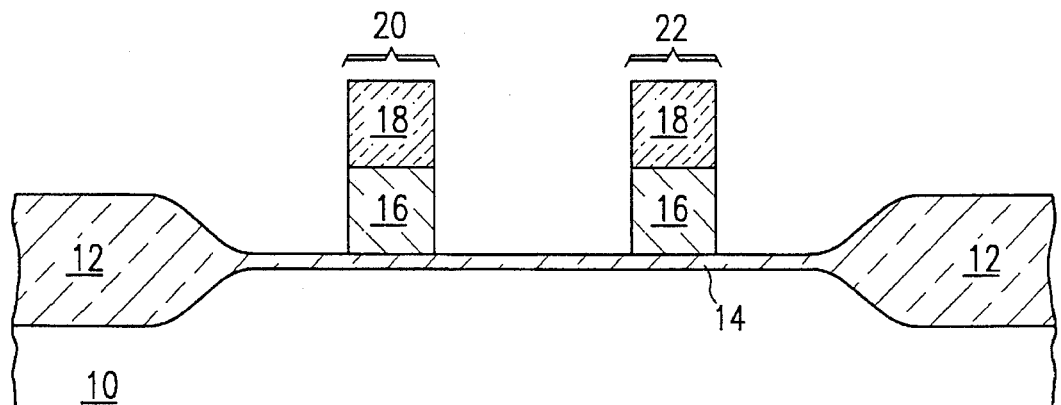
FIGS. 1 and 2 are sectional views illustrating a prior art method for forming a self-aligned contact.
Figure 2:
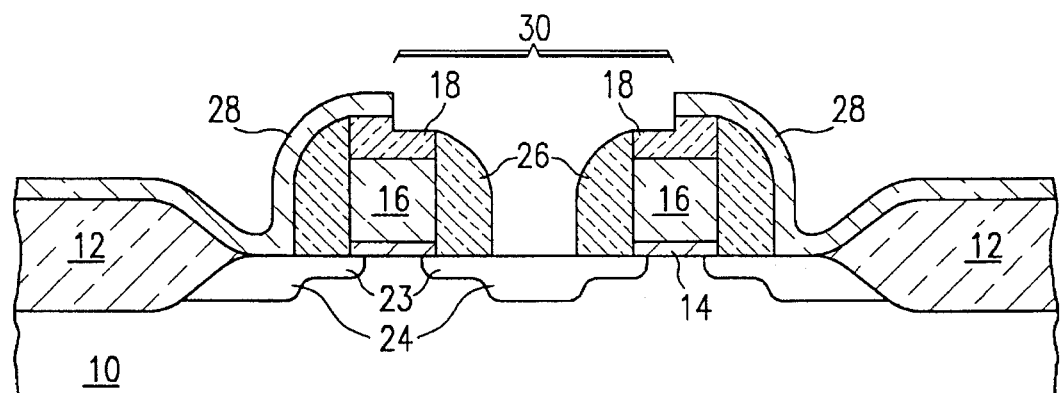

FIGS. 1 and 2 depict a prior art process used to form a self-aligned contact. Referring to FIG. 1, a self-aligned contact will be fabricated on a substrate 10. Isolation regions of field oxide 12 are formed in and on the substrate 10, and a thin layer of gate oxide 14 is then grown on the exposed areas of the substrate 10. A conductive layer 16 is deposited over the device, followed by an insulating layer 18. Typically, the conductive layer 16 is made from polycrystalline silicon, and is approximately 4000 angstroms thick. The insulating layer 18 is made from oxide, and is approximately 3500 angstroms thick. As will be explained in greater detail below, initially the insulating layer 18 must be thick in order to protect the conductive layer 16 during subsequent processing steps. A masking layer (not shown) is then deposited and patterned on the device. An anisotropic etch is performed to define the gate electrodes 20,22.

Referring to FIG. 2, lightly doped drain regions 23 are formed in the substrate 10. A layer of oxide is deposited over the device and sidewall spacers 26 are created along the vertical sidewalls of the gate electrodes 20, 22, by anisotropically etching the layer. Source and drain regions 24 are formed in the substrate 10. A conformal layer 28 of oxide is then deposited over the device, and a via 30 is opened anisotropically etching the device.

As one skilled in the art will recognize, overetching a layer is common to ensure complete removal of the material. As a result of overetching during formation of the sidewall spacers 26 and the via 30, the initial thickness of the insulating layer 18 is decreased. Typically, after formation of the sidewall spacers 26 the insulating layer 18 is approximately 1000–2000 angstroms thick. After opening a via, a part of the insulating layer in the via is etched away, leaving that portion of the layer approximately 500 angstroms thick. Because the insulating layer 18 protects the conductive layer 16 from exposure during formation of the sidewall spacers 26 and the via 30, a certain minimum thickness is needed to guarantee protection of the gate electrodes 20, 22.

However, when the gate electrodes 20, 22 are complete, and the via is opened, the topography of the device is now a problem for subsequent processing steps. Materials later deposited on the device may not adequately cover some areas due to the height and contour of the gate electrodes 20, 22 and the via 30.

Figure 3:
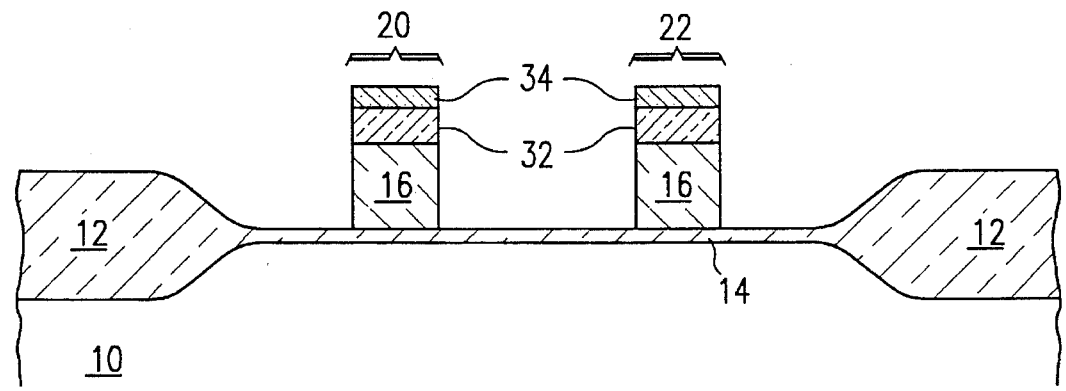
FIGS. 3–9 are sectional views illustrating a preferred method for forming a self-aligned contact according to the present invention.

FIG. 3 illustrates formation of the gate electrodes 20, 22 according to the present invention. Isolation regions of field oxide 12 are formed in and on the substrate 10, and a thin layer of gate oxide 14 is then grown on the exposed areas of the substrate 10. A conductive layer 16 is deposited over the device, followed by a thin insulating layer 32. As described in connection with FIGS. 1 and 2, the conductive layer 16 can be made from polycrystalline silicon, and is approximately 4000 angstroms thick. The thin insulating layer 32 can be made from oxide, and have a thickness of approximately 500–1000 angstroms. A barrier layer 34 is then deposited over the device. The barrier layer can be made from any material with a high etch selectivity to the material in the insulating layer 32. In this example, the barrier layer 34 can be made from titanium nitride, which has a high etch selectivity to oxide. The thickness of the barrier layer can be approximately 300–500 angstroms. A masking layer (not shown) is then deposited and patterned on the device. An anisotropic etch is performed to define the gate electrodes 20, 22.

Figure 4:
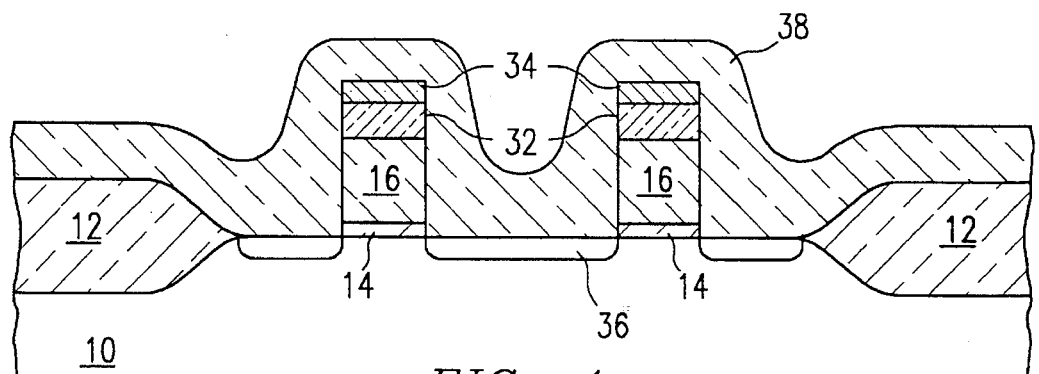

Referring to FIG. 4, a lightly doped drain region 36 is formed in the substrate 10. A conformal layer 38 of oxide is then deposited over the device.

Figure 5:
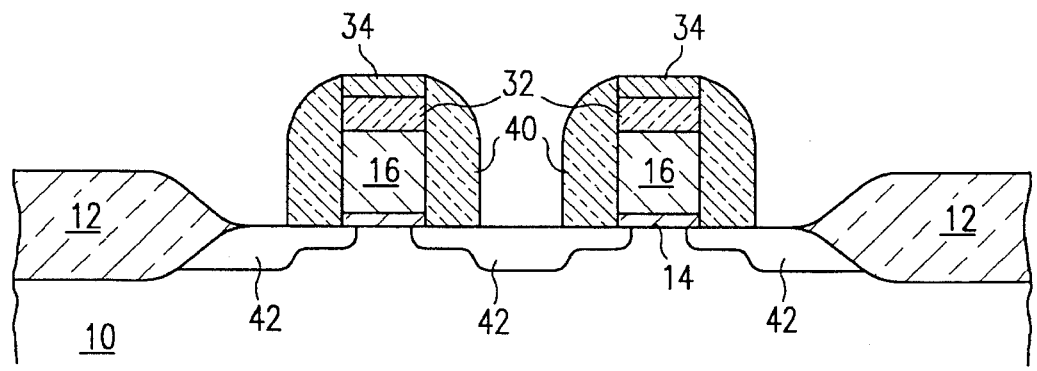

FIG. 5 illustrates the device after sidewall spacers 40 have been created, and source drain regions 42 have been formed. The barrier layer 34 protects the insulating layer 32 and the conductive layer 16 during the anisotropic etch performed to create the sidewall spacers 40.

Figure 6:
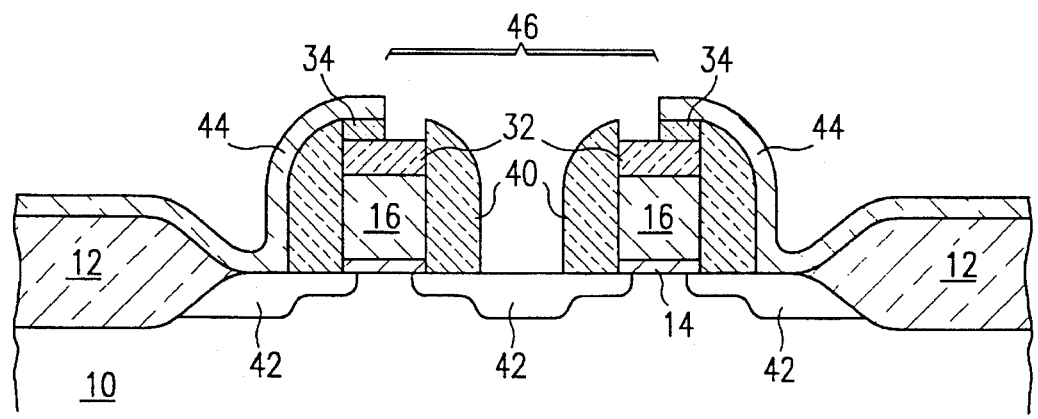
Figure 7:
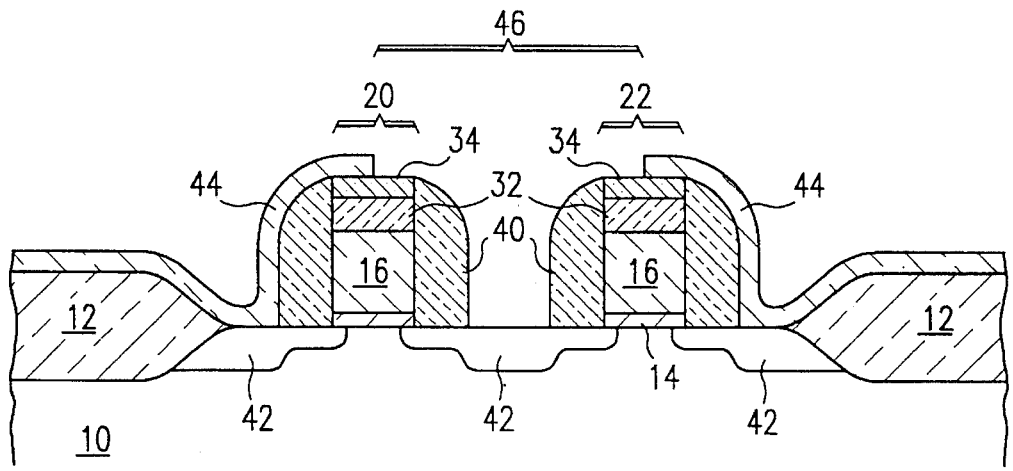
Figure 8:
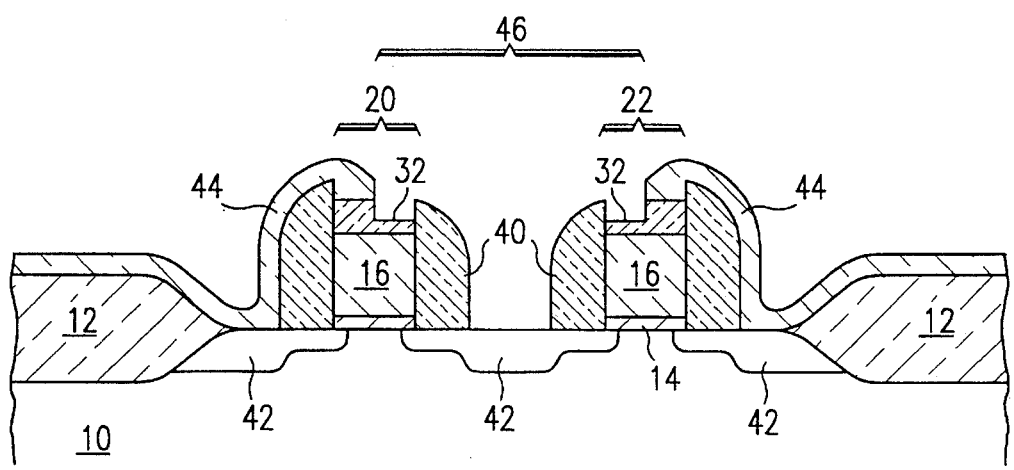

FIGS. 6–8 illustrate several alternative methods which can be used to complete the self-aligned contact. In FIG. 6, a conformal insulating layer 44 is deposited over the device. A masking layer (not shown) is deposited and patterned on the device, and an anisotropic etch is performed to open a via 46. The barrier layer 34 again protects the insulating layer 32 and the conductive layer 16 from damage during the etch. A portion of the barrier layer 34 is then removed, typically by performing a wet etch. The area of the barrier layer 34 closest to the via 46 can be oxidized, thereby capping the end of the remaining barrier layer 34. As those skilled in the art will appreciate this is especially desirable if the remaining barrier layer 34 is made from a conductive material. A contact may be formed by depositing conductive material into the via 46.

FIG. 7 illustrates an alternative to removing a portion of the barrier layer 34. If the barrier layer 34 is made from material that is not conductive, it is possible to leave it on top of the gate electrodes 22. If the barrier layer 34 is made from material that is conductive, it can be oxidized and left on top of the gate electrodes 20, 22. A conformal insulating layer 44 of oxide is then deposited over the device. A masking layer (not shown) is deposited and patterned on the device and an anisotropic etch is performed to open a via 46. The barrier layer 34 again protects the insulating layer 32 and conductive layer 16 from damage during the etch. A contact may now be formed by depositing conductive material into the via 46.

Referring to FIG. 8, the barrier layer 34 is completely removed from the gate electrodes 20, 22 before the via 46 is opened. Typically this is done by performing an isotropic etch. The conformal insulating layer 44 is then deposited over the device. The via 46 is opened, and a contact can be formed by depositing conductive material into the via 46.

Figure 9:
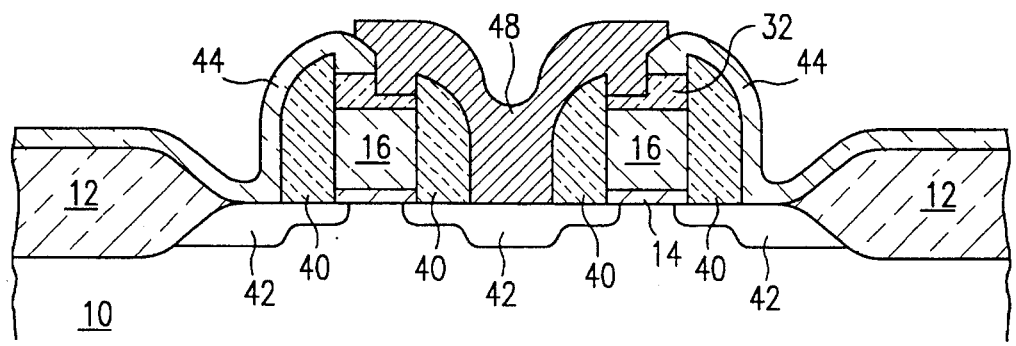

FIG. 9 illustrates the self-aligned contact once these processing steps are complete, and a conductive contact is created by depositing conductive material 48 into the via 46. The conductive material 48 can be, for example, made from silicided polycrystalline silicon. One skilled in the art will recognize that this conductive material 48 can be used in conjunction with the processes described in connection with FIGS. 6 and 7.

According to the present invention, the thickness of the insulating layer 18 can be reduced from approximately 3500 angstroms to approximately 1000 angstroms through the use of a barrier layer 34. The total height of the gate electrodes 20, 22 can be reduced from approximately 6000 angstroms to approximately 4000 angstroms. This reduction in height will improve the topography and make further processing of the device easier and more effective.

While the invention has been particularly shown and described with reference to a preferred embodiment, it will be understood by those skilled in the art that various changes in form and detail may be made therein without departing from the spirit and scope of the invention.

What is claimed is:

1. A method for forming a self-aligned contact for a device, comprising the steps of:

forming a gate electrode having a first insulating layer and a barrier layer on the upper surface thereof, wherein the barrier layer is comprised of a material having a high etch selectivity to a material in the first insulating layer;

forming sidewall spacers alongside the gate electrode, wherein the barrier layer protects the gate electrode during formation of the sidewall spacers;

depositing a second insulating layer over the device; and opening a via through the second insulating layer.

2. The method of claim 1, wherein a portion of the barrier layer is converted into an insulating layer after formation of the via.

3. The method of claim 2, wherein said step of converting a portion of the barrier layer into an insulating layer comprises oxidizing a portion of the barrier layer.

4. The method of claim 1, wherein said barrier layer is removed after formation of the sidewall spacers.

5. The method of claim 4, wherein said step of removing the barrier layer after formation of the sidewall spacers comprises isotropically etching said barrier layer.

6. The method of claim 1, wherein a portion of the barrier layer is removed after opening the via, wherein the barrier layer protects the gate electrode during formation of the via.

7. The method of claim 6, wherein said step of removing a portion of the barrier layer after opening the via comprises isotropically etching said layer, wherein a part of the barrier layer remains.

8. The method of claim 7, wherein a portion of the remaining barrier layer is converted into an insulating area.

9. The method of claim 8, wherein said step of converting a portion of the remaining barrier layer into an insulating area comprises oxidizing a portion of the barrier layer.

10. The method of claim 1, wherein said step of forming a gate electrode comprises the steps of:

forming a third insulating layer over a portion of a semiconductor substrate;

depositing a conductive layer over the device;

depositing the first insulating layer over the conductive layer;

depositing the barrier layer over the first insulating layer; and removing a portion of the barrier layer, the first insulating layer, and the conductive layer to define the gate electrode.

11. The method of claim 10, wherein said step of forming a third insulating layer comprises growing thermal oxide on a portion of the semiconductor substrate.

12. The method of claim 10, wherein said conductive layer comprises polycrystalline silicon.

13. The method of claim 10, wherein said first insulating layer comprises oxide.

14. The method of claim 10, wherein said barrier layer comprises titanium nitride.

15. The method of claim 10, wherein said step of removing a portion of the barrier layer, the first insulating layer, and the conductive layer comprises the steps of:

depositing and patterning a masking layer over the device;

anisotropically etching the device to open the via; and removing the masking layer.

16. The method of claim 1, wherein said step of forming sidewall spacers comprises the steps of:

depositing a conformal insulating layer over the device; and anisotropically etching said conformal insulating layer.

17. The method of claim 16, wherein said conformal insulating layer comprises oxide.

18. The method of claim 1, wherein said second insulating layer comprises oxide.

19. The method of claim 1, wherein the device is formed on a semiconductor substrate wherein said step of opening a via comprises the steps of:

depositing and patterning a masking layer over the device;

anisotropically etching the device so as to expose a portion of the semiconductor substrate to open the via; and removing the masking layer.

20. The method of claim 1, wherein a conductive contact is formed after opening the via.

21. The method of claim 20, wherein said conductive contact is made between the gate electrode and a second gate electrode adjacent to the gate electrode, wherein the contact is self-aligned with respect to the two gate electrodes.

22. A method for forming a self-aligned contact for a device, comprising the steps of:

forming a first insulating layer over a portion of a semiconductor substrate;

depositing a conductive layer over the device;

depositing a second insulating layer over the conductive layer wherein the barrier layer is comprised of a material having a high etch selectivity to a material in the second insulating layer;

depositing a barrier layer over the second insulating layer;

removing a portion of the barrier layer, second insulating layer and conductive layer to define a gate electrode;

depositing a third insulating layer over the device;

forming sidewall spacers from the third insulating layer, wherein the barrier layer protects the gate electrode during formation of the sidewall spacers;

depositing a fourth insulating layer over the device; and opening a via through the fourth insulating layer.

23. The method of claim 22, wherein said step of forming a first insulating layer comprises growing thermal oxide on a portion of the semiconductor substrate.

24. The method of claim 22, wherein said conductive layer comprises polycrystalline silicon.

25. The method of claim 22, wherein said second insulating layer comprises oxide.

26. The method of claim 22, wherein said barrier layer comprises titanium nitride.

27. The method of claim 22, wherein said step of removing a portion of the barrier layer, second insulating layer and conductive layer comprises the steps of:

depositing and patterning a masking layer over the device;

anisotropically etching the device to remove a portion of the barrier layer, second insulating layer and conductive layer to define the gate electrode; and removing the masking layer.

28. The method of claim 22, wherein said third insulating layer comprises oxide.

29. The method of claim 22, wherein said step of forming sidewall spacers comprises anisotropically etching the third insulating layer.

30. The method of claim 22, wherein said fourth insulating layer comprises oxide.

31. The method of claim 22, wherein said step of opening a via comprises the steps of:

depositing and patterning a masking layer over the device;

anisotropically etching the device to expose a portion of the semiconductor substrate to open the via; and removing the masking layer.

32. The method of claim 22, wherein said barrier layer is removed after formation of the sidewall spacers.

33. The method of claim 32, wherein said step of removing the barrier layer comprises isotropically etching the layer.

34. The method of claim 22, wherein a portion of said barrier layer is removed after opening the via, wherein the barrier layer protects the gate electrode during formation of the via.

35. The method of claim 34, wherein said step of removing a portion of the barrier layer after opening the via comprises isotropically etching said layer wherein a remaining barrier layer remains.

36. The method of claim 35, wherein a portion of the remaining barrier layer is converted into an insulating area.

37. The method of claim 36, wherein said step of converting a portion of the barrier layer into an insulating area comprises oxidizing a portion of the barrier layer.

38. The method of claim 22, wherein a conductive contact is formed after opening the via.

39. The method of claim 38, wherein said conductive contact is made between the gate electrode and a second gate electrode adjacent to the gate electrode, wherein the contact is self-aligned with respect to the two gate electrodes.

* * * * *